United States Patent
Levin et al.

(10) Patent No.: US 7,575,977 B2
(45) Date of Patent: Aug. 18, 2009

(54) SELF-ALIGNED LDMOS FABRICATION METHOD INTEGRATED DEEP-SUB-MICRON VLSI PROCESS, USING A SELF-ALIGNED LITHOGRAPHY ETCHES AND IMPLANT PROCESS

(75) Inventors: Sharon Levin, Migdal Haemek (IL); Ira Naot, Migdal Haemek (IL); Alexei Heiman, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 395 days.

(21) Appl. No.: 11/691,459

(22) Filed: Mar. 26, 2007

(65) Prior Publication Data

US 2008/0242033 A1    Oct. 2, 2008

(51) Int. Cl.
*H01L 21/336* (2006.01)
(52) U.S. Cl. .............................. 438/286; 257/E21.427
(58) Field of Classification Search ................ 438/286, 438/525; 257/E21.427
See application file for complete search history.

(56) References Cited

U.S. PATENT DOCUMENTS

| 6,100,556 | A | 8/2000 | Drowley et al. |
| 6,483,149 | B1 | 11/2002 | Mosher et al. |
| 6,800,528 | B2 * | 10/2004 | Sasaki ........................ 438/286 |
| 6,818,494 | B1 * | 11/2004 | Chen et al. ................... 438/224 |
| 2005/0112822 | A1 | 5/2005 | Litwin |
| 2005/0148114 | A1 | 7/2005 | Rhodes |
| 2006/0006489 | A1 | 1/2006 | Park |

OTHER PUBLICATIONS

Bengtsson et al. "Small-Signal and Power Evaluation of Novel BiCMOS-Compatible Short-Channel LDMOS Technology," IEEE Transactions on Microwave Theory and Techniques, vol. 51, No. 3, Mar. 2003, pp. 1052- 1056.
Itonaga et al. "A High-Performance and Low-Noise CMOS Image Sensor with an Expanding Photodiode under the Isolation Oxide," Electron Devices Meeting, 2005, IEDM Technical Digest, IEEE International, Dec. 5-7, 2005, 4 pgs.

* cited by examiner

*Primary Examiner*—Chandra Chaudhari
(74) *Attorney, Agent, or Firm*—Bever, Hoffman & Harms, LLP; Patrick T. Bever

(57) ABSTRACT

An integrated circuit includes both LDMOS devices and one or more low-power CMOS devices that are concurrently formed on a substrate using a deep sub-micron VLSI fabrication process. The LDMOS polycrystalline silicon (polysilicon) gate structure is patterned using a two-mask etching process. The first etch mask is used to define a first edge of the gate structure located away from the deep body/drain implant. The second etch mask is then used to define a second edge of the gate structure, and the second etch mask is then retained on the gate structure during subsequent formation of the deep body/drain implant. After the deep implant, shallow implants and metallization are formed to complete the LDMOS device.

20 Claims, 7 Drawing Sheets

US 7,575,977 B2

SELF-ALIGNED LDMOS FABRICATION METHOD INTEGRATED DEEP-SUB-MICRON VLSI PROCESS, USING A SELF-ALIGNED LITHOGRAPHY ETCHES AND IMPLANT PROCESS

FIELD OF THE INVENTION

This invention relates to integrated circuits (ICs) formed on semiconductor substrates (e.g., silicon), and more particularly to Lateral Double-Diffused Metal-Oxide-Silicon (LDMOS) transistors that are fabricated using deep sub-micron very large scale integration (VLSI) fabrication processes.

BACKGROUND OF THE INVENTION

LDMOS (lateral double-diffused MOS) transistors are quickly replacing bipolar transistors as power devices in intelligent power integrated circuits due to their performance advantage. Minimizing the drain-source resistance when a LDMOS transistor is turned on ($Rds_{on}$) is important for power and high voltage applications, for minimizing power dissipation, and for purposes of minimizing the chip area utilized by the LDMOS. In order to fabricate a high voltage LDMOS with a short channel having desirable $Rds_{on}$ & breakdown voltage characteristics, it is important to both produce the body implant (or the Drain implant) of the LDMOS device using a provide a deep (high energy) implant process (to sustain high voltages), and also to align the body implant (or the drain implant) to the edge of the gate electrode silicon (herein "polysilicon") gate (to reduce device footprint, hence lower $Rds_{on}$).

One typical fabrication technique that is used to produce "self-aligned" implant regions involves forming a polysilicon structure, and then using the polysilicon structure as a mask during the implant diffusion process (i.e., such that the implant region is defined by and therefore aligned with an edge of the polysilicon structure). This technique is effective in standard CMOS fabrication techniques in the production of power CMOS transistors because standard CMOS polysilicon structures are relatively thick (e.g., 0.45 microns) so that the implanted ions do not penetrate through the polysilicon during the implant and enter the underlying substrate. However, deep sub-micron VLSI fabrication processes utilize relatively thin (e.g., 0.2 microns) polysilicon gate structures. These thin polysilicon structures are suitable for producing low voltage CMOS transistors because, the required source/drain diffusions can be produced using low energy implant processes, but may not be suitable for producing LDMOS transistors or other structures that require deep implant regions self-aligned to the thin polysilicon. That is, using polysilicon gate structures as masks requires matching the polysilicon thickness to the implant energy. If the implant diffusion process is performed at a high enough energy, the implanted ions will penetrate the polysilicon and diffuse into the (e.g., channel) region of the substrate located below the polysilicon, thus causing failure of the VLSI device. This is a particular problem in the fabrication of LDMOS devices because the body implant (or the Drain implant) require a high energy implant, to sustain high diode breakdown.

Another fabrication technique that may be used to form deep (high energy) body implants (or Drain implants) using VLSI fabrication processes involves forming the deep implants prior to forming the polysilicon structures. A problem with this non-self aligned approach is that precise alignment of the polysilicon edge to the body implant (or Drain implant) is difficult to achieve, which produces an inconsistent and hence undesirable drain-source resistance $Rds_{on}$.

None of the approaches described above produce a suitable VLSI LDMOS transistor. The "self-aligned" prior art approach provides the proper alignment between the implant and polysilicon gate, but cannot be used to produce the required body implant (or the Drain implant). Conversely, the non-self-aligned approach provides sufficiently deep body implants (or Drain implants), but does not provide certainty of proper alignment between the implant and gate.

Thus, what is needed is a method for fabricating LDMOS devices using VLSI fabrication techniques that both facilitates the use of the thinner polysilicon gate structures associated with VLSI technology, and provides LDMOS body/Drain implant regions that are both sufficiently deep and reliably aligned with corresponding polysilicon gate structures.

SUMMARY OF THE INVENTION

The present invention provides a method for fabricating LDMOS devices using VLSI fabrication techniques in which a two-step polysilicon etching process is utilized to pattern the LDMOS gate structure, wherein the subsequent deep implant is performed through the same mask opening that was used to define a critical edge of the LDMOS gate structure (i.e., the second poly etch mask is retained during the deep implant process). Because the photo resist of the second mask is retained over the polysilicon gate during the high energy (deep) implant process, the present invention facilitates the production of LDMOS devices using the thinner polysilicon associated with VLSI fabrication techniques that have relatively short channels, superior $Rds_{on}$ characteristics, high break-down voltages, and high operating frequencies. That is, the second mask serves to increase the effective thickness of the polysilicon during the deep implant process, thereby preventing implanted ions from undesirably diffusing under the LDMOS gate structure. Thus, by adjusting the photo resist thickness of the second mask, the deep implant process can be performed at a suitably high energy level without penetrating through the LDMOS gate structure, thereby facilitating LDMOS body/Drain implant regions that are sufficiently deep to assure optimal LDMOS operation. Further, because the critical edge of the LDMOS gate structure is aligned with the edge of the second mask, the present invention facilitates LDMOS body/Drain implant regions that are reliably aligned with corresponding LDMOS gate structures.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in the fabrication techniques for VLSI ICs having deep implant regions that are registered (self-aligned) to associated polysilicon structures, and is described with particular reference to the fabrication of LDMOS structures that are fabricated using deep-sub-micron VLSI fabrication processes. The following description is presented to enable one of ordinary skill in the art to make and use the invention as provided in the context of a particular application and its requirements. As used herein, directional terms such as "upper" and "lower" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

1st Embodiment

Figure 1:
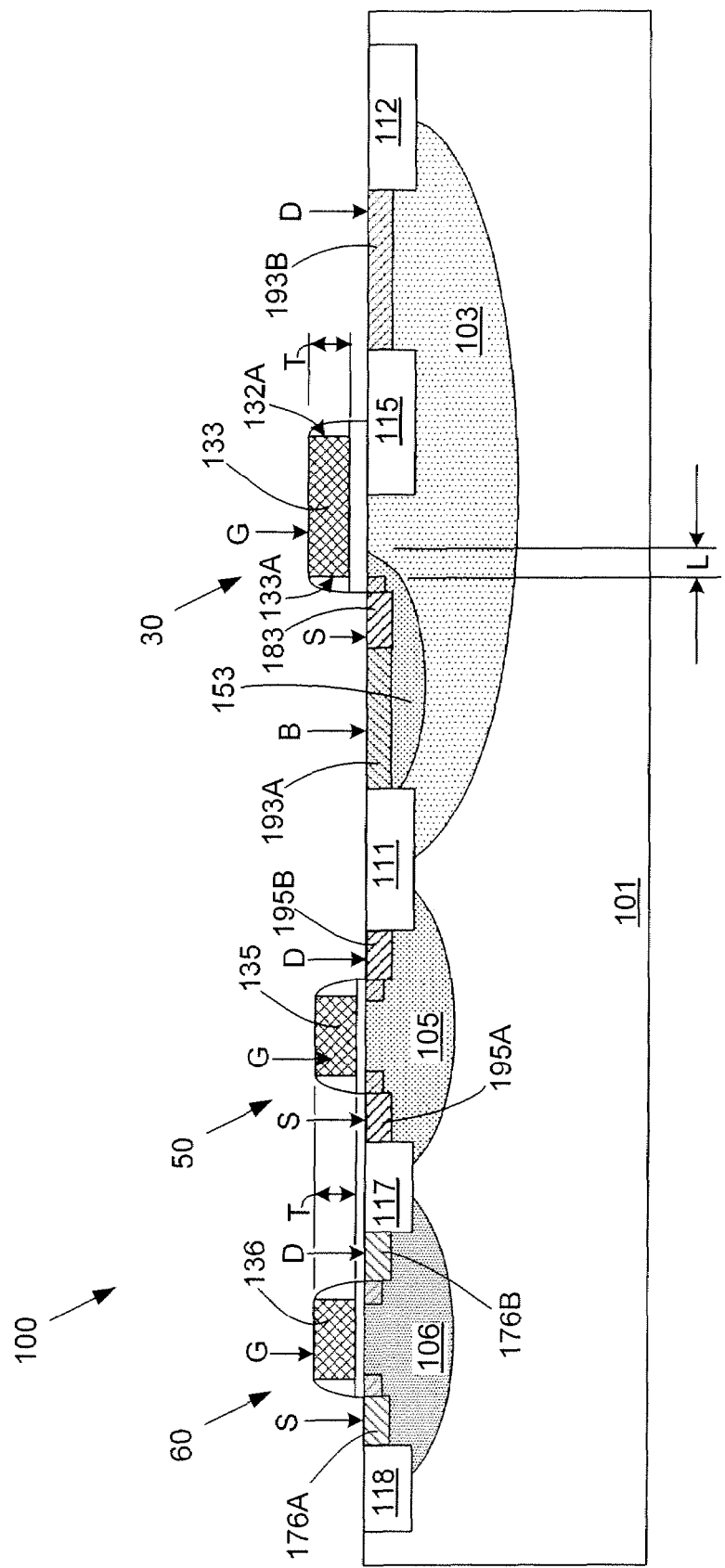
FIG. 1 is simplified cross-sectional elevation view showing an exemplary IC device including a self-aligned Body LD nMOS device and low-power CMOS devices according to an embodiment of the present invention.

FIG. 1 is a cross-sectional side view showing a simplified integrated circuit (IC) 100 that is formed on a semiconducting (e.g., monocrystalline silicon) substrate 101 using deep sub-micron VLSI fabrication techniques, and includes an N-type lateral double-diffused metal-oxide-silicon (LDMOS) device 30, as well as low-voltage CMOS (i.e., NMOS and PMOS) devices 50 and 60.

LDMOS device 30 is formed in an N-type tub diffusion 103 formed between STI isolation regions 111 and 112. An LDMOS polycrystalline silicon (polysilicon) gate structure 133 is formed on a gate oxide layer 123, and is located partially over a central isolation region 115. A deep P-body implant region 153 is formed in N-type tub diffusion 103 between peripheral isolation region 111 and central isolation region 115. Formed on an upper surface of substrate 101 in P-body implant region 153 are an N+ source region 183, which is disposed below an edge 133A of gate structure 133, and a P+ bulk implant 193A, which is disposed between N+ source region 183 and isolation region 111. An N+ drain implant 193B is also formed on an upper surface of substrate 101 in N-tub diffusion region 103, but is located between central isolation region 115 and peripheral isolation region 112. Bulk (B), source (S), gate (G) and drain (D) connections are indicated by vertical arrows and are implemented using standard metallization techniques.

LDMOS 30 is a device composed of MOSFET transistor with a diffusion resistor in serial, the device can hold high drain voltages and can be used as a low Rdson power switch, power driver and/or an RF power amplifier. The channel region is defined by the overlap of P-body region 153 and the gate electrode 133, while the diffusion region is defined by the distance between the edge of P-body region 153, closer to the drain and the N+ drain region 193B. Channel length is an important figure of the device, characteristics such as saturation current, Threshold voltage, leakages, capacitance, breakdown voltages and Rdson are defined by it. The diffusion region defines the quasi-saturation, diode breakdown voltage, capacitance and Rdson. Specifically, Rdson is defined herein as device resistance Ron multiplied by the device area, where Ron is the device resistance in the device's linear operating region (i.e., Ron=Vdrain/Idrain when Vgate=Vdd and Vdrain=0.1V). Aligning the body implant to the gate edge is important for shortening the device length. A device with a shorter channel and shorter diffusion region under the gate, will have lower Rdson, lower gate to channel and gate to drain capacitances, as a result the power dissipation during on state and during switching is reduced. A self-aligned device is also more robust to process variation (such as misalignment in poly mask) in comparison with a non self aligned device.

The NMOS and PMOS devices depicted in FIG. 1 are exemplary standard low-voltage devices that are included to indicate the VLSI process steps utilized to produce LDMOS device 30. For example, NMOS device 50 and PMOS device 60 include polysilicon gate structures 135 and 136, respectively, that have substantially the same thickness T as LDMOS gate structure 133. In addition, N+ source/drain implant regions 195A and 195B, and P+ source/drain implant regions 176A and 176B are formed concurrently with corresponding N+ and P+ source/drain/bulk implants associated with LDMOS device 30. These and other shared process steps are described in the following exemplary embodiment.

FIGS. 2(A) to 2(H) are cross-sectional side views showing a portion of substrate 101 during a deep sub-micron VLSI fabrication process according to a first exemplary embodiment of the present invention. In particular, the first embodiment describes a standard VLSI low-voltage CMOS fabrication method for producing N-channel LDMOS devices having self-aligned body implants and Shallow Trench Isolation (STI). A method for fabricating an exemplary self-aligned Drain P-channel LDMOS device is described in the second embodiment provided below.

Figure 2A:
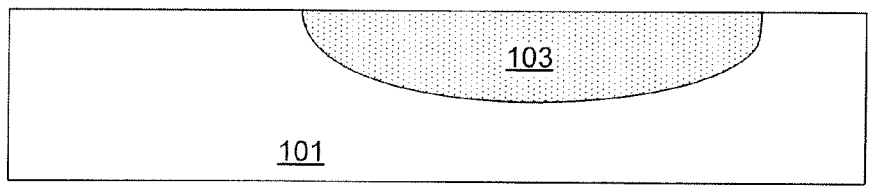
FIGS. 2(A), 2(B), 2(C), 2(D), 2(E), 2(F), 2(G), 2(H), 2(I) and 2(J) are cross-sectional side views showing a process for fabricating the IC FIG. 1 according to another embodiment of the present invention.

Referring to FIG. 2(A), the structure is formed on a p-type monocrystalline silicon substrate 101. The process begins by forming an LDMOS drain N-tub (tub diffusion) 103 in substrate 101 by masking, implant, and thermal diffusion according to known techniques.

Figure 2B:
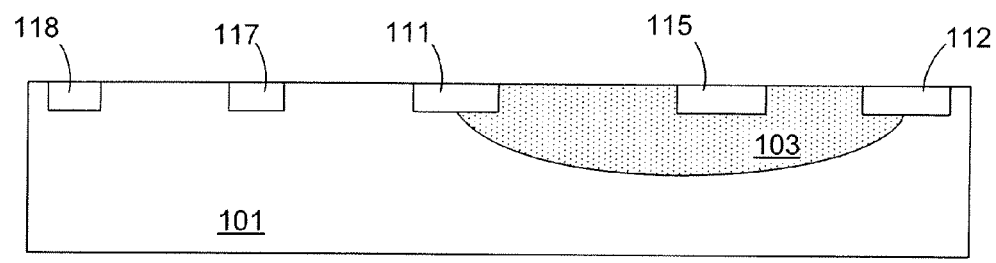

As shown in FIG. 2(B), VLSI isolation oxide structures 111 and 112 are then formed in the upper surface of substrate 101 at opposite edges of N-tub 103, and a central oxide region 115 is formed between regions 111 and 112 (i.e., inside N-tub 103). Additional isolation oxide structures (e.g., structures 117 and 118) are formed in substrate 101 such that these additional isolation oxide structures are spaced from isolation oxide structures 111 and 112, as shown. In the present embodiment, isolation oxide structures 111, 112, 115, 117 and 118 are formed using known STI processes. In alternative embodiments, these isolation oxide structures are formed using poly buffered local oxidation of silicon (PBLOCOS) or standard LOCOS techniques, both known to those skilled in the art.

Figure 2C:
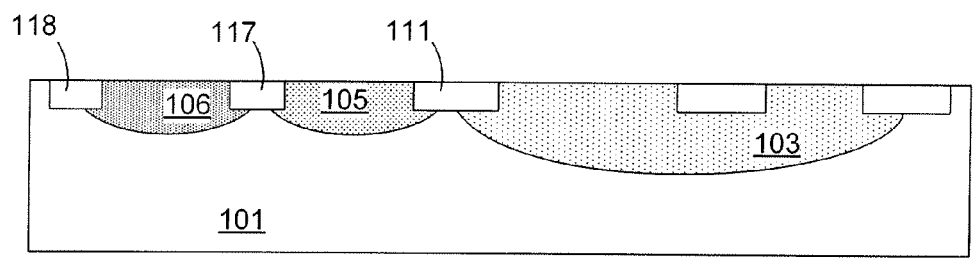

FIG. 2(C) shows substrate 101 after the formation of a low voltage P-type well region (P-well) 105 and a low voltage N-type well region (N-well) 106 using associated lithographic masks, implants and thermal activation according to known techniques. As indicated in the figure, low voltage P-well 105 is disposed between isolation oxide structures 111 and 117, and low voltage N-well 106 is separated from low-voltage P-well 105 by isolation oxide structure 117. Note that the depicted positions of P-well 105 and N-well 106 and their associated isolation structures are arbitrary, and these features may be disposed at other locations of substrate 101.

Figure 2D:
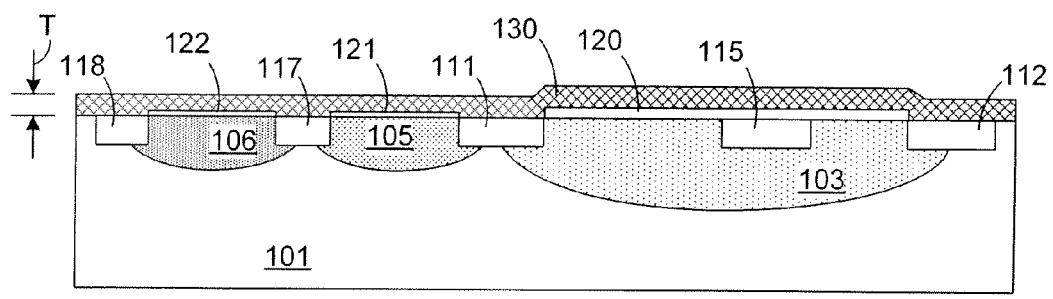

FIG. 2(D) shows substrate 101 after the formation of thin oxide/dielectric layers and a polysilicon layer 130. In particular, an LDMOS gate oxide layer 120 is formed over N-tub 103, and low-voltage gate dielectric layers 121 and 122 are formed over P-well 105 and a low voltage N-well 106, respectively, using a known combination of oxidation, deposition and selective dielectric etch processes. In one embodiment, LDMOS gate oxide layer 120 is formed using thermal oxidation followed by oxide deposition process and has a thickness of approximately 220 angstroms, and low-voltage gate dielectric layers 121 and 122 are formed using thermal oxidation process and have a thickness of approximately 40 angstroms. Then polysilicon layer 130 having a substantially uniform thickness T (e.g., approximately 0.2 microns) is formed over the isolation oxide structures and oxide/dielectric layers using known techniques. As used herein, the term "substantially uniform thickness" is intended to mean that polysilicon layer 130 is formed during a single (e.g., deposition) process, whereby variations (if any) in the thickness of polysilicon layer 130 are unintentional and due solely to local effects.

Figure 2E:
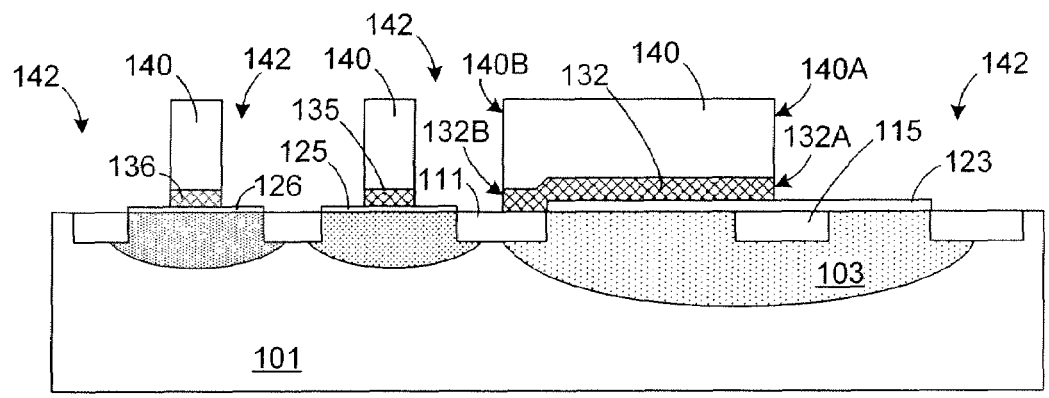

Referring to FIG. 2(E), a first mask 140 is then formed on the polysilicon layer, and then first mask 140 is utilized to etch the polysilicon layer to form various polysilicon structures. In one embodiment, first mask 140 is formed using photoresist material that is deposited, exposed through a reticule, and etched using known photolithographic techniques to form a plurality of openings 142. Note that the various edges of mask 140 that define openings 142 are disposed over corresponding oxide/dielectric layers. For example, mask edge 140A is disposed over oxide region 115, mask edge 140B is disposed over oxide region 111. The polysilicon layer portions that are exposed through openings 142 are then etched according to known techniques, thereby producing an interim (partially formed) LDMOS gate structure 132 disposed over tub diffusion region 103, a NMOS gate structure 135 disposed over P-well region 105, and an PMOS gate structure 136 disposed over N-well region 106. Note that this first poly etch process forms interim LDMOS gate structure 132 such that a first edge 132A is located over oxide region 115, and a second (opposing) edge 132B is located over oxide region 111. First mask 140 is removed after the first polysilicon etching process is completed.

Figure 2F:
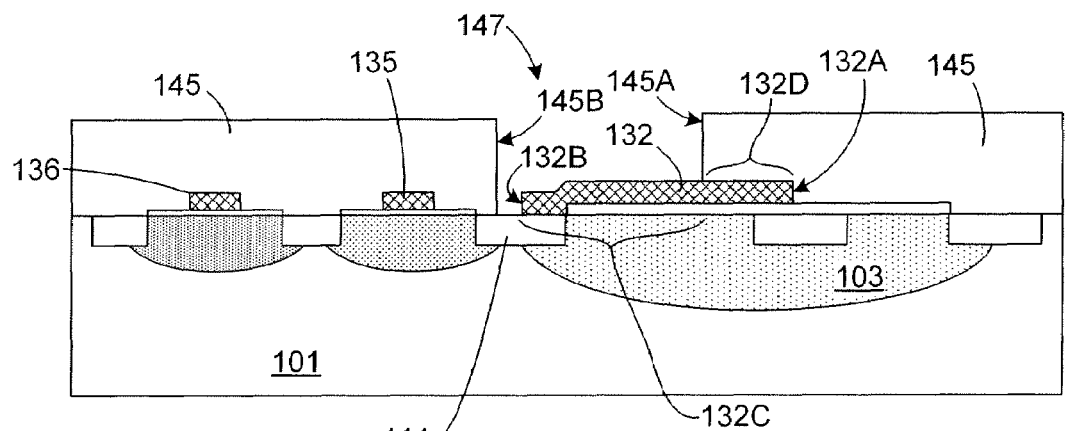

Referring to FIG. 2(F), a second mask 145 is then patterned in a manner similar to that described above with reference to first mask 140 such that second mask 145 covers NMOS gate structure 135 and PMOS gate structure 136, and defines an opening 147 that exposes a portion 132C of LDMOS gate structure 132. Note that mask 145 covers a predetermined portion 132D of LDMOS gate structure 132 that includes first side edge 132A, and portion 132C extends from side edge 145A of mask 145 into opening 147. Note also that a second side edge 145B is disposed over oxide region 111 such that side edge 132B of LDMOS gate structure 132 is exposed, and opening 147 extends over tub diffusion region 103 to a point located between oxide regions 111 and 115. It is important to note here that during this second etching process the low voltage CMOS gates 135 and 136 are protected by the photo resist of second mask 145.

Figure 2G:
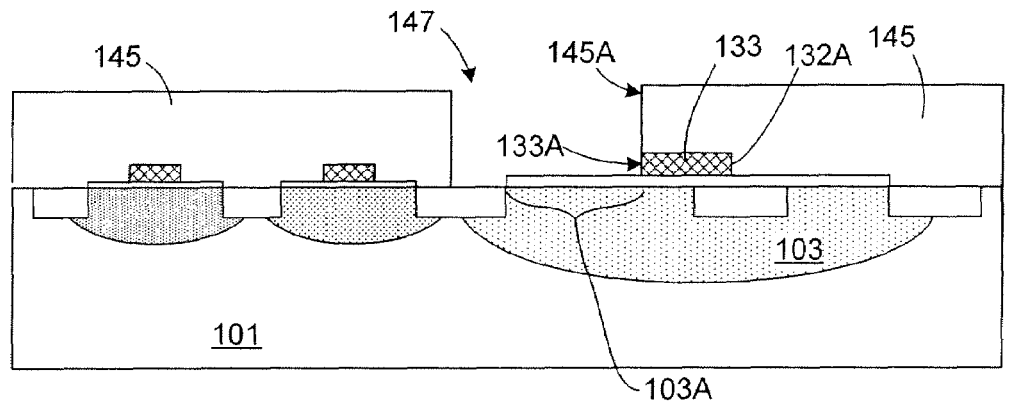

Referring to FIG. 2(G), a second polysilicon etching process is then performed through opening 147 of second mask 145 to remove the exposed portion (i.e., portion 132C; FIG. 2(F)), thereby completing the formation of LDMOS (first polysilicon) gate structure 133. Note that the second etching process defines a second edge 133A of LDMOS gate structure 133 (i.e., LDMOS gate structure 133 now extends from first edge 132A, which is covered by mask 145, to second edge 133A, which is aligned with and exposed through side edge 145A of second mask 145). Note also that second edge 132A of LDMOS gate structure 133 is positioned over tub diffusion region 103 such that a portion 103A of tub region 103 is exposed through opening 147.

Figure 2H:
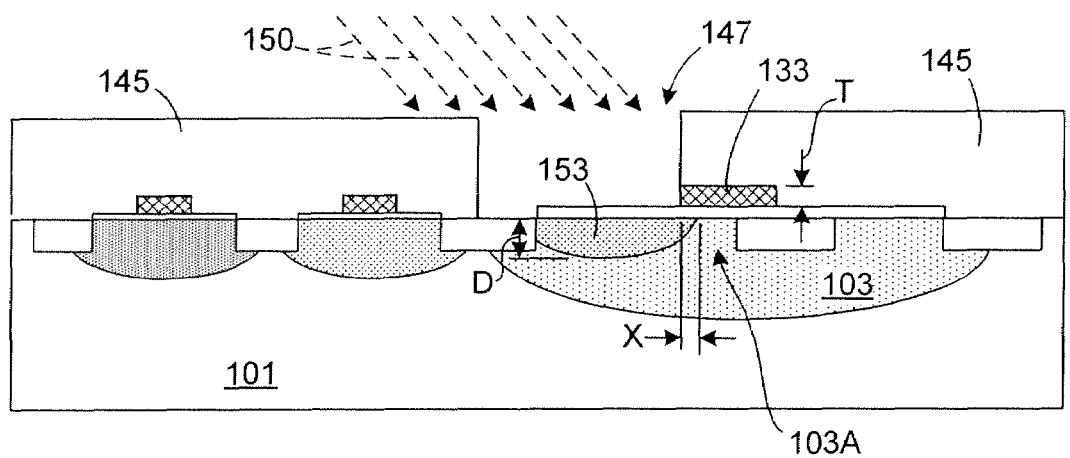

Referring to FIG. 2(H), a P-type dopant 150 is then implanted into substrate 101 through opening 147 using a high energy implant process to form a deep body implant region 153 inside tub diffusion region 103 that extends from first oxide region 111 to a point adjacent to said second edge 133A of LDMOS gate structure 133.

According to an aspect of the present invention, the high energy implant process is performed at an energy level that is sufficient to form an optimal LDMOS body implant region 153, but undesirable doping under LDMOS gate structure 133 is prevented by second mask 145. As used herein, "high energy implant process" is defined as an implant process performed at an energy level higher than the stopping power of the LDMOS gate electrode, with thickness T. Under these implant conditions, in the absence of second mask 145, the implanted material would penetrate LDMOS gate structure 133 and produce undesirable doping under the entire length of LDMOS gate structure 133. By retaining second mask 145 over LDMOS gate structure 133 during the high energy implant process, dopant 150 is prevented from penetrating LDMOS gate structure 133, thereby providing a desired undoped region 103B, which is located under gate 133 and disposed between deep body implant region 153 and oxide region 115.

In accordance with another aspect of the present invention, by utilizing second mask 145 both to define side edge 133A of LDMOS gate structure 133 and to perform the high energy implant process, deep body implant region 153 is self-aligned to LDMOS gate structure 133, thereby facilitating the production of short-channel LDMOS devices having low $Rds_{on}$ characteristics.

Referring again to FIG. 2(H), in accordance with an embodiment of the present invention, the high energy implant process is performed such that dopant material 150 is directed an acute angle relative the surface of substrate 101 (as indicated in the figure) such that deep implant region 153 extends a predetermined distance X under edge 133A of LDMOS gate structure 133. Those skilled in the art will recognize that this gate overlap facilitates optimal LDMOS operating characteristics. In particular, the overlap of deep implant (Body) region 153 under gate electrode 133 forms the channel region where a conductive inversion layer is formed when transistor is in an "on" state. The effective channel length is defined by this overlap, and this effective channel length is a prime parameter defining LDMOS characteristics. Second mask 145 is removed after the second polysilicon etching process is completed.

Figure 2I:
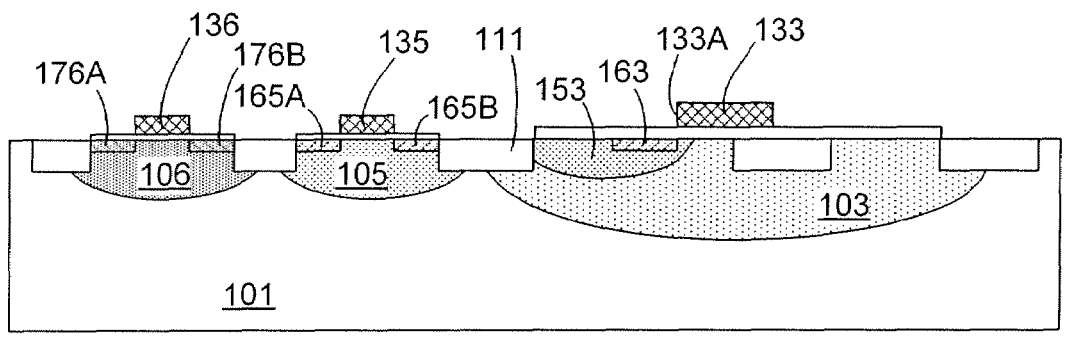

FIG. 2(I) shows substrate 101 after subsequent light doping processes are performed to provide LDMOS and low-voltage CMOS source/drain extension implants. An N-type dopant is implanted using a corresponding mask (not shown) to form lightly doped region 163 in deep implant region 153 such that one end of lightly doped region 163 is disposed adjacent to (e.g., aligned with) second edge 133A LDMOS gate structure 133, and lightly doped region 163 extends from LDMOS gate structure 133 toward oxide region 111. Note that N-type extension regions 165A and 165B are simultaneously formed in P-well 105 on opposite sides of gate structure 135. During a second implant process using corresponding masks (not shown), P-type extension regions 176A and 176B are formed in N-well 106 on opposite sides of gate structure 136.

Figure 2J:
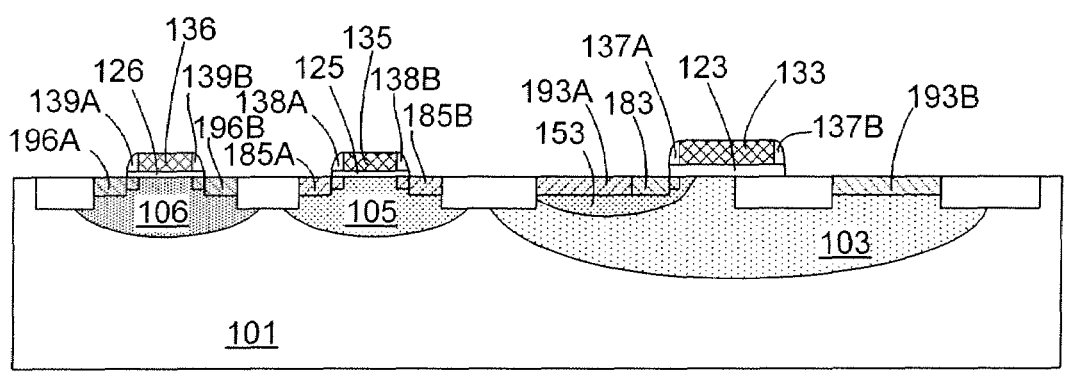

Next, as shown in FIG. 2(J), spacer structures are formed on each of the polysilicon gate structures, and heavily doped source/drain and well contact are formed in each of the corresponding diffusions. Sidewall spacers 137A and 137B are formed on opposite sides of LDMOS gate structure 133, sidewall spacers 138A and 138B are formed on opposite sides of NMOS gate structure 135, and sidewall spacers 139A and 139B are formed on opposite sides of PMOS gate structure 136 using known techniques. Next, N+ LDMOS source implant 183 is formed in tub diffusion 153, and N+ CMOS source/drain implants 185A and 185B are simultaneously formed in P-well 105 on opposite sides of polysilicon gate 135 using a corresponding mask (not shown). Subsequent to (or before) the formation of the N+ implants, P+ implants are simultaneously formed in substrate 101 as indicated in FIG. 2(J) using another mask (not shown) according to known techniques. Specifically, a P+ LDMOS bulk implant 193A is formed between LDMOS source implant 183 and isolation region 111, and a P+ LDMOS drain implant 193B is formed between LDMOS gate structure 133 and isolation structure 112. In addition, CMOS source/drain implants 196A and 196B are simultaneously formed on opposite sides of polysilicon gate 136.

After the N+ and P+ implants are completed, the deep sub-micron VLSI fabrication process proceeds with salicide blocking layer deposition and mask lithography, followed by silicidation processing according to known techniques, and then standard VLSI fabrication processing is performed to provide an interconnect stack, etc.

2$^{nd}$ Embodiment

Figure 3:
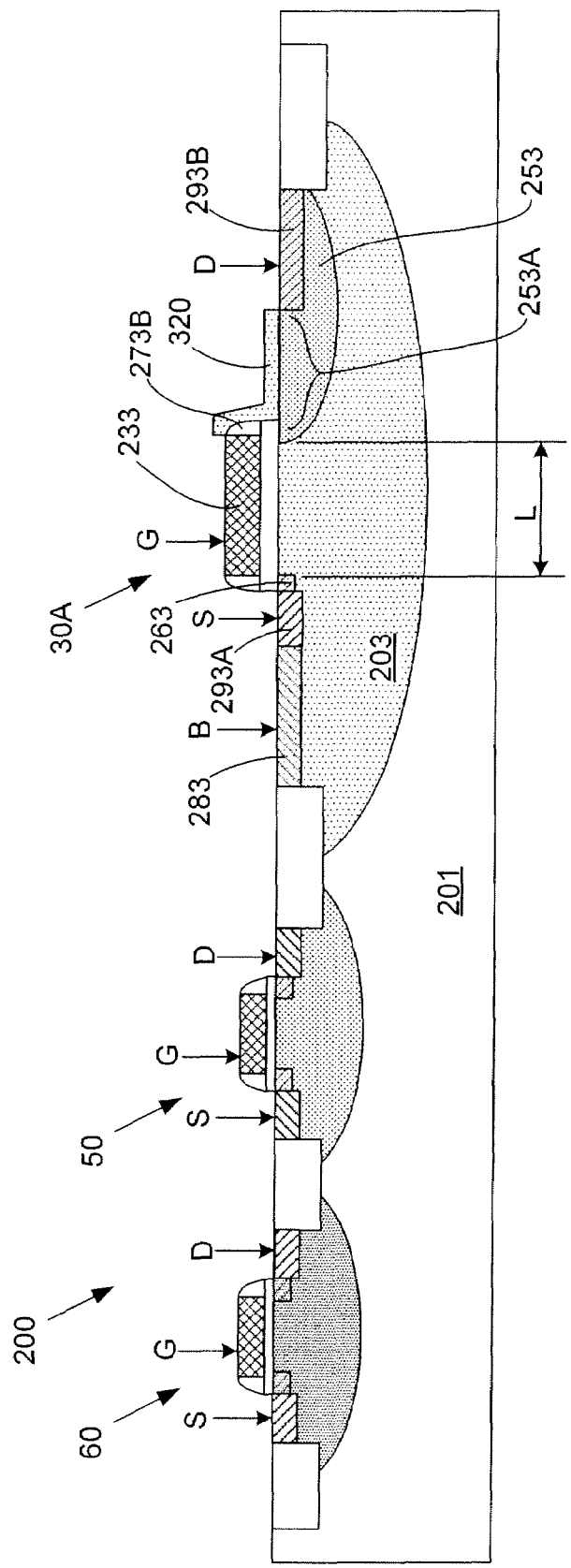
FIG. 3 is a simplified cross-sectional elevation view showing an exemplary IC device including a self-aligned Drain LD pMOS device and low-power CMOS devices according to another embodiment of the present invention.

FIG. 3 is a cross-sectional side view showing a simplified integrated circuit (IC) 200 that is formed on a substrate 201 using deep sub-micron VLSI fabrication techniques, and includes a self-aligned Drain LD pMOS device 30A, NMOS device 50 and PMOS device 60. Structures that are the same or similar to those of the first embodiment are identified with the same reference number.

LDMOS device 30A differs from LDMOS device 30 (discussed above) in several respects.

First, LDMOS device 30A is formed in an N-type tub diffusion 203 that extends between STI isolation regions 211 and 212 (i.e., is formed without central STI isolation structure 115; see FIG. 1). This arrangement is better in terms of lowering Rdson because it allows a direct path for the current flowing from the source through the channel to the drain. In the first embodiment (described above) the current has to pass under the STI isolation region 115, which increases the resistance.

Figure 4A:
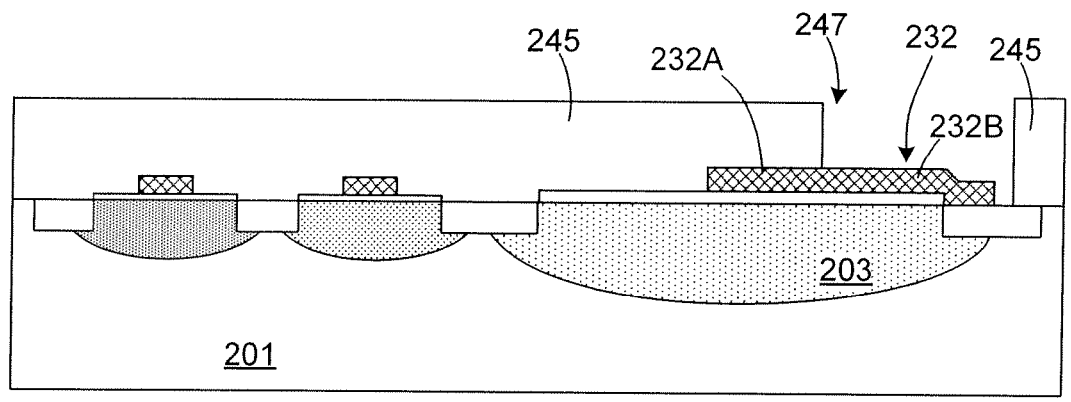
FIGS. 4(A) and 4(B) are cross-sectional side views showing portions of a process for fabricating the IC of FIG. 3 according to another exemplary embodiment of the present invention.
Figure 4B:
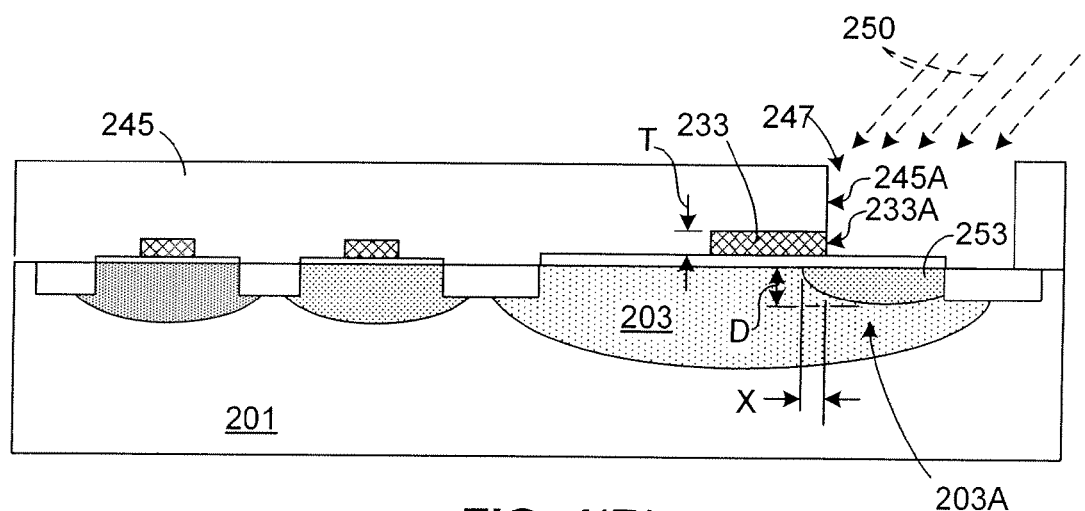

Second, instead of a self-aligned deep implant on the source side of LDMOS gate 233, LDMOS device 30A includes a deep drain-side implant 253 that is aligned to the drain side edge of LDMOS gate 233. FIGS. 4(A) and 4(B) show a (second) mask 245 used during a second polysilicon etching process and subsequent high energy implant process that are used to generate deep drain-side implant 253. As indicated in FIG. 4(A), a first portion 232A of partially formed polysilicon gate structure 232 is covered by mask 245, and a second portion 232B of polysilicon gate structure 232 extends into a window 247 of mask 245. This exposed second portion 232B is then etched, leaving completed LDMOS gate structure 233 such that a side edge 233A of LDMOS gate structure is coplanar with a side edge 245A of mask 245, and a portion 203A of N-type tub diffusion region 203 is exposed (as shown in FIG. 4(B)). P-type dopant 250 is then implanted through window 247 in the manner described above to form deep drain-side implant 253 having an energy that is larger than the stopping power of gate structure 233 with thickness T, and that extends a predetermined distance X under edge 233A of LDMOS gate structure 233.

Figure 5A:
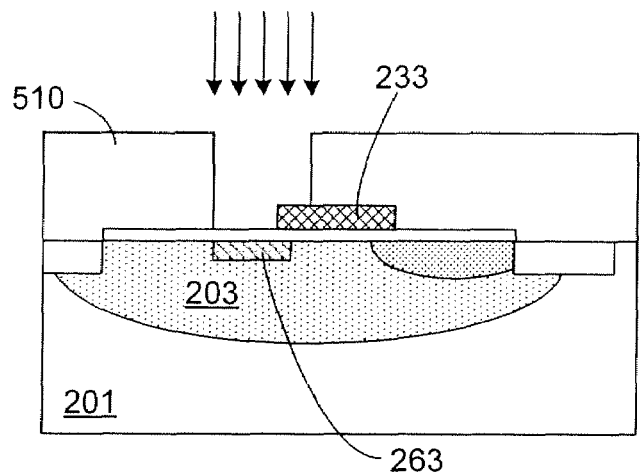
FIGS. 5(A), 5(B) and 5(C) are cross-sectional side views showing portions of the process for forming the LD pMOS of FIG. 3 according to another exemplary embodiment of the present invention.
Figure 5B:
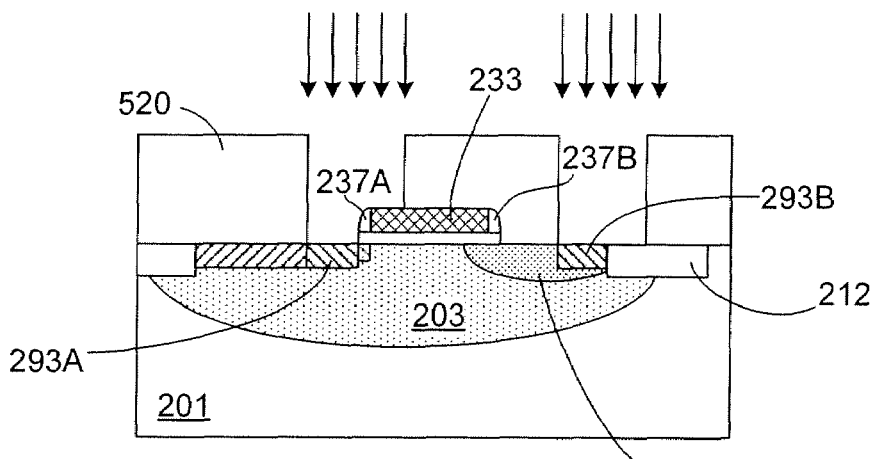
Figure 5C:
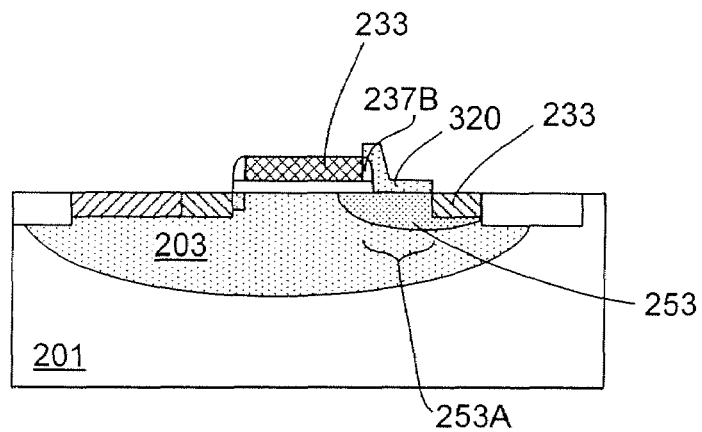

Returning to FIG. 3, another difference associated with LDMOS 30A is that a salicide blocking structure 320 is formed over the drain side edge of LDMOS gate 233, and is used as a mask during the formation of salicide on P+ drain implant 293B and polysilicon gate 233. The region 253A between P+ contact region 293 and polysilicon gate 233 forms the diffusion resistor for LDMOS 30A, and therefore lightly doped P-type (PLDD) diffusions and heavily doped P+ implants are omitted from this region. FIGS. 5(A) to 5(C) are cross-sectional side views showing the LDMOS cell leading up to the formation of the salicide blocking structure 320 according to an embodiment of the invention. FIGS. 5(A) and 5(B) show masks 510 and 520 that are respectively used during the formation of lightly doped P-region 263 and P+ source/drain regions 293A and 293B. Both masks are formed such that the implant on the source side partially overlaps gate 233 to account for process variations. Referring to FIG. 5(B), after forming sidewall spacers 237A and 237B, P+ source implant 293A is formed on the source side of gate 233, and P+ drain implant 293B is formed on the drain side. P+ source implant 293A is aligned to sidewall spacer 237A, and drain implant 293B is aligned to STI isolation region 212 (i.e., not aligned to polysilicon gate 233). As shown in FIG. 5(C), to prevent the subsequently-formed silicidation from shunting the diffusion resistor region 253A, this region is protected with salicide blocking layer 320 (e.g., TEOS deposition, mask, TEOS etch) that extends over sidewall spacer 237B and onto polysilicon gate 233. In order to account for process variations the blocking mask must partially overlap the poly on one side and overlap the P+ drain region 233 on the other side. This layer is then etched where silicidation is desired. The remaining process steps are similar to those described above.

Returning to FIG. 3, LDMOS 30A is a p-MOSFET transistor in serial with a P-type diffusion resistor, it can handle high drain voltages and be used as a low Rdson power switch, power driver and or an RF power amplifier. The channel region is defined by the N-tub region 203 directly under the gate 233 while the diffusion resistor is the region defined by the P drain implant 253. Aligning the drain implant to the gate edge enables the use of a shorter channel length and a shorter diffusion resistor, both lowering Rdson, gate to channel and gate to drain capacitances, which in result lowers power dissipation during switching.

Although the present invention has been described with respect to certain specific embodiments, it will be clear to those skilled in the art that the inventive features of the present invention are applicable to other embodiments as well, all of which are intended to fall within the scope of the present invention. For example, although the present invention has been described with reference to LDMOS ICs formed by deep sub-micron VLSI fabrication processes, the methods described with reference to the above embodiment may be modified to produce other types of ICs that require self-registration (e.g., self-alignment or offset alignment achieved by a diagonal implant process) between a deep implant region and a relatively thin polysilicon structure.

The invention claimed is:

1. A method for fabricating an integrated circuit (IC) on a substrate such that the including a lateral double-diffused metal-oxide-silicon (LDMOS) device having a first polycrystalline silicon (polysilicon) gate structure, a P-channel metal-oxide-silicon (PMOS) device having a second polysilicon gate structure, and an N-channel metal-oxide-silicon (NMOS) device having a third polysilicon gate structure, wherein the method comprises:

forming a polysilicon layer over the substrate such that the polysilicon layer has a substantially uniform thickness;

forming a first mask on the polysilicon layer, and subsequently etching the polysilicon layer though openings defined in the first mask to form the second and third polysilicon gate structures, and to define a first side edge of the first polysilicon gate structure;

forming a second mask over the second and third polysilicon gate structures, and over a portion of the first polysilicon gate structure, and subsequently etching the first polysilicon gate structure though an opening defined in the second mask to define a second edge of the first polysilicon gate structure; and implanting a dopant into the substrate through the opening in the second mask using a high energy implant process to form a deep implant region adjacent to said second edge of the third polysilicon gate structure such that a depth of said deep implant region is greater than said thickness of said polysilicon layer.

2. The method of claim 1, further comprising forming a tub diffusion region in the substrate, wherein forming the first mask and etching the polysilicon layer includes forming said first polysilicon gate structure over the tub diffusion region.

3. The method of claim 2, further comprising forming at least one isolation region along a peripheral edge of the tub diffusion region using one of a shallow trench isolation, a poly buffered local oxidation of silicon, and a local oxidation of silicon process.

4. The method of claim 2, further comprising:

forming a P-type well region and an N-type well region that are spaced from each other and from the tub diffusion region; and forming a first dielectric layer on the substrate over the tub diffusion region, a second dielectric layer on the substrate over the N-type well region, and a third dielectric layer on the substrate over the P-type well region, wherein forming the polysilicon layer comprises simultaneously depositing the polysilicon layer on each of the first, second and third dielectric layers.

5. The method of claim 4, further comprising respectively forming first and second isolation regions in a surface of the substrate at opposite edges of the tub diffusion region, wherein forming the second mask comprises defining an opening in the second mask between the first isolation region and the second isolation region over the tub diffusion region, and wherein etching the first polysilicon gate structure though the opening defined in the second mask comprises exposing a portion of the tub diffusion region.

6. The method of claim 5, wherein implanting the dopant into the substrate through the opening in the second mask comprises directing the dopant at an angle such that the deep implant region extends a predetermined distance under the second edge of the first polysilicon gate structure.

7. The method of claim 6, further comprising:

simultaneously forming a first lightly doped region adjacent to the first polysilicon gate structure, and second and third lightly doped regions in one of the P-type well region and the N-type well region;

simultaneously forming sidewall spacer structures on side edges of each of the first, second and third polysilicon gate structures; and simultaneously forming a first heavily doped region adjacent to the first polysilicon gate structure, and second and third heavily doped regions in said one of the P-type well region and the N-type well region.

8. The method of claim 7, further comprising forming a third isolation region in a surface of the substrate between the first and second isolation regions, wherein forming the second mask comprises defining said opening such that said opening extends from a point located over the first isolation region to a point located over the tub diffusion region between the first isolation region and the third isolation region.

9. The method of claim 8, further comprising simultaneously forming a fourth heavily doped region in a second portion of the deep implant region adjacent to the first heavily doped region, a fifth heavily doped region in the tub diffusion region between the second isolation region and the third isolation region, and sixth and seventh heavily doped regions in a second one of the P-type well region and the N-type well region.

10. The method of claim 7, wherein forming the second mask comprises defining said opening such that said opening extends from a point located over the second isolation region to a point located over the tub diffusion region between the first isolation region and the second isolation region.

11. The method of claim 10, further comprising simultaneously forming a fourth heavily doped region adjacent to the first heavily doped region, a fifth heavily doped region in the tub diffusion region between the second isolation region and the third isolation region, and sixth and seventh heavily doped regions in a second one of the P-type well region and the N-type well region.

12. A method for fabricating an integrated circuit (IC) on a substrate such that the including a lateral double-diffused metal-oxide-silicon (LDMOS) device having a polycrystalline silicon (polysilicon) LDMOS gate structure, a P-channel metal-oxide-silicon (PMOS) device having a polysilicon PMOS gate structure, and an N-channel metal-oxide-silicon (NMOS) device having a polysilicon NMOS gate structure, wherein the method comprises:

simultaneously forming an interim gate structure and the PMOS and NMOS gate structures;

forming a mask over a portion of the interim gate structure, such that a portion of the interim gate structure is exposed though an opening defined in the mask;

etching the exposed portion of the interim gate structure to define said LDMOS gate structure; and implanting a dopant into the substrate through the opening in the mask using an angled high energy implant process to form a deep implant region adjacent to an edge of the LDMOS gate structure such that a portion of said deep implant region extends a predetermined distance under said LDMOS gate structure.

13. The method of claim 12, wherein simultaneously forming the interim gate structure and the PMOS and NMOS gate structures comprises:

forming a polysilicon layer over the substrate such that the polysilicon layer has a substantially uniform thickness;

forming a first mask on the polysilicon layer; and etching the polysilicon layer though openings defined in the first mask to form the PMOS and NMOS gate structures, and to define said interim gate structure.

14. The method of claim 13, further comprising forming a tub diffusion region in the substrate, wherein forming the first mask and etching the polysilicon layer includes forming said interim gate structure over the tub diffusion region.

15. The method of claim 14, further comprising forming at least one isolation region along a peripheral edge of the tub diffusion region using one of a shallow trench isolation, a poly buffered local oxidation of silicon, and a local oxidation of silicon process.

16. The method of claim 14, further comprising:
forming a P-type well region and an N-type well region that are spaced from each other and from the tub diffusion region; and
forming a first dielectric layer on the substrate over the tub diffusion region, a second dielectric layer on the substrate over the N-type well region, and a third dielectric layer on the substrate over the P-type well region,
wherein forming the polysilicon layer comprises simultaneously depositing the polysilicon layer on each of the first, second and third dielectric layers.

17. The method of claim 16, further comprising respectively forming first and second isolation regions in a surface of the substrate at opposite edges of the tub diffusion region,
wherein forming said mask comprises defining an opening in the mask between the first isolation region and the second isolation region over the tub diffusion region, and wherein etching the interim gate structure though the opening defined in the mask comprises exposing a portion of the tub diffusion region.

18. The method of claim 17, further comprising:
simultaneously forming a first lightly doped region adjacent to the LDMOS gate structure, and second and third lightly doped regions in one of the P-type well region and the N-type well region;
simultaneously forming sidewall spacer structures on side edges of each of the PMOS, NMOS and LDMOS gate structures; and
simultaneously forming a first heavily doped region adjacent to the LDMOS gate structure, and second and third heavily doped regions in said one of the P-type well region and the N-type well region.

19. The method of claim 12, further comprising:
forming a first lightly doped region adjacent to the LDMOS gate structure;
forming sidewall spacer structures on side edges of each of the PMOS, NMOS and LDMOS gate structures;
and simultaneously forming a first heavily doped region adjacent to the LDMOS gate structure on said first lightly doped region and a second heavily doped region in said second heavily doped region LDMOS gate structure by a diffusion resistor region.

20. The method of claim 19, further comprising forming a salicide blocking layer over said diffusion resistor region.

* * * * *